(12) United States Patent
Chou

(10) Patent No.: US 7,195,716 B2
(45) Date of Patent: Mar. 27, 2007

(54) ETCHING PROCESS AND PATTERNING PROCESS

(75) Inventor: Pei-Yu Chou, Taipei County (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 10/711,838

(22) Filed: Oct. 8, 2004

(65) Prior Publication Data

US 2006/0076313 A1 Apr. 13, 2006

(51) Int. Cl.
*B44C 1/22* (2006.01)
(52) U.S. Cl. .............. 216/41; 216/77; 156/656.1; 156/659.11; 359/291; 430/11; 430/316; 430/317; 438/707; 438/717
(58) Field of Classification Search .............. None
See application file for complete search history.

(56) References Cited

U.S. PATENT DOCUMENTS

| | | | | |
|---|---|---|---|---|
| 5,882,489 A | * | 3/1999 | Bersin et al. | 204/192.35 |
| 6,010,829 A | * | 1/2000 | Rogers et al. | 430/316 |
| 6,322,714 B1 | * | 11/2001 | Nallan et al. | 216/67 |
| 6,440,864 B1 | * | 8/2002 | Kropewnicki et al. | 438/710 |
| 6,541,843 B2 | * | 4/2003 | Yin et al. | 257/639 |
| 6,542,282 B2 | * | 4/2003 | Smith et al. | 359/291 |
| 6,692,903 B2 | * | 2/2004 | Chen et al. | 430/329 |
| 2003/0228532 A1 | * | 12/2003 | Mui et al. | 430/30 |

OTHER PUBLICATIONS

Wolf, Silicon Processing for the VLSI Era, 2002, Lattice Press, vol. 4, p. 248.*
Wolf et al., Silicon Processing for the VLSI Era, 1986, Lattice Press, vol. 1, p. 523.*
Wolf, Silicon Processing for the VLSI Era, 2002, Lattice Press, vol. 4, p. 249.*

* cited by examiner

*Primary Examiner*—Nadine Norton
*Assistant Examiner*—Patricia A. George
(74) *Attorney, Agent, or Firm*—Jianq Chyun IP Office

(57) ABSTRACT

An etching process is described. A material layer having a bottom anti-reflection coating (BARC) and a patterned photoresist layer thereon is provided. An etching step is performed to the BARC using the patterned photoresist layer as a mask. A cleaning step is performed to remove the polymer formed on the surface of the patterned photoresist layer. Thereafter, another etching step is performed to the material layer using the patterned photoresist layer as a mask.

15 Claims, 3 Drawing Sheets

ETCHING PROCESS AND PATTERNING PROCESS

BACKGROUND OF THE INVENTION

1. Field of the Invention

The present invention relates to an etching process. More particularly, the present invention relates to an etching process that includes a step of removing the polymer generated in the etching step of the bottom anti-reflection coating (BARC), and relates to a patterning process including the etching process.

2. Description of the Related Art

As the IC industry advances rapidly, the dimension of devices is continuously reduced to make higher and higher integration degree. When the process linewidth is down to less than 0.13 µm, the KrF-248 nm lithography techniques are no more suitable, and ArF-193 nm lithography techniques are used instead. However, since light having a shorter wavelength has higher reflectivity at the interface of the photoresist layer and the die, the resulting photoresist patterns are distorted more easily. The problem is even more significant when a layer of high-reflectivity material, such as, polysilicon or metal like aluminum, is to be patterned, since the degree of pattern distortion increases with the intensity of the reflective light. Accordingly, when the process linewidth is small and the reflectivity of the film to be patterned is high, controlling the critical dimension is particularly difficult.

Conventionally, the issue of reflective light is solved by forming a bottom anti-reflection coating (BARC) on the material layer to be etched prior to the photoresist layer. After the photoresist layer is patterned with a lithography method, the BARC is etched/patterned using the patterned photoresist layer as a mask. Then, the material layer is etched using the patterned photoresist layer as a mask, so that the photoresist patterns are transferred to the material layer.

However, during the etching step of the BARC, polymer as an etching by-product is usually deposited on the patterned photoresist layer, so that the photoresist patterns are changed and the pattern linewidth is increased. Therefore, in the latter step of etching the material layer, the patterns transferred to the material layer and the critical dimension thereof are not correct.

SUMMARY OF THE INVENTION

In view of the foregoing, this invention provides an etching process that includes a polymer removal step to keep the critical dimension unchanged and make the pattern transfer accurate.

This invention also provides a patterning process that includes the above etching process and therefore has the same effects.

The etching process of this invention is described as follows. A material layer having a bottom anti-reflection coating (BARC) and a patterned photoresist layer thereon is provided. An etching step is performed to the BARC using the patterned photoresist layer as a mask, wherein polymer as an etching by-product is formed on the patterned photoresist layer. A cleaning step is performed to remove the polymer from the patterned photoresist layer. Thereafter, another etching step is performed to the material layer using the patterned photoresist layer as a mask.

According to a preferred embodiment, the above cleaning step can utilize an ionized gas to remove the polymer. The ionized gas preferably has a higher etching rate to the polymer than to the material layer.

In addition, the material layer may be a polysilicon layer. When the material layer is a polysilicon layer, the ionized gas preferably contains fluorine ions, oxygen ions or a combination thereof.

Moreover, the above bottom anti-reflection coating may include an inorganic material or an organic material.

Furthermore, the patterned photoresist layer can be trimmed to reduce its linewidth after the material layer having the patterned photoresist layer thereon is provided.

Since the polymer generated in the etching step of the BARC is removed in the subsequent cleaning step, the photoresist patterns can be accurately transferred to the material layer in the latter etching step of the material layer.

The patterning process of this invention includes the above-mentioned etching process of this invention. A BARC and a photoresist layer are formed on a material layer, and the photoresist layer is patterned using a lithography method. The patterned photoresist layer is then trimmed, and an etching step is performed to the BARC using the patterned photoresist layer as a mask, wherein polymer as an etching by-product is formed on the patterned photoresist layer. A cleaning step is performed to remove the polymer from the patterned photoresist layer. Then, another etching step is performed to the material layer using the patterned photoresist layer as a mask. Among the above steps, the two etching steps and the cleaning step can be performed in-situ.

According to a preferred embodiment, the above cleaning step can utilize an ionized gas to remove the polymer. The ionized gas preferably has a higher etching rate to the polymer than to the material layer.

In addition, the material layer may be a polysilicon layer. When the material layer is a polysilicon layer, the ionized gas preferably contains fluorine ions, oxygen ions or a combination thereof.

Moreover, the above BARC can include an inorganic material or an organic material.

Since the linewidth of photoresist patterns is reduced with the trimmed step and the polymer generated in the subsequent etching step of the BARC is removed, the linewidth of the patterns transferred to the material layer can be reduced.

It is to be understood that both the foregoing general description and the following detailed description are exemplary, and are intended to provide further explanation of the invention as claimed.

DESCRIPTION OF THE PREFERRED EMBODIMENTS

Figure 1A:
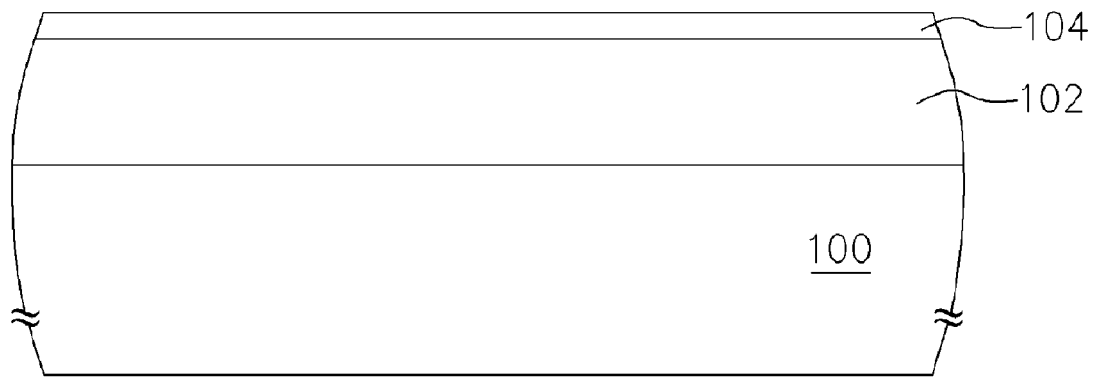
FIGS. 1A–1E schematically illustrate a patterning process including an etching process according to a preferred embodiment of this invention in a cross-sectional view.

Referring to FIG. 1A, a substrate 100 having a material layer 102 to be etched thereon is provided, and a BARC 104 is formed on a material layer 102.

The material layer 102 may be a polysilicon layer.

The BARC 104 may include an inorganic material or an organic material. The inorganic material can be formed with chemical vapor deposition (CVD), and may be amorphous carbon, silicon nitride, silicon oxynitride or titanium oxide.

Figure 1B:
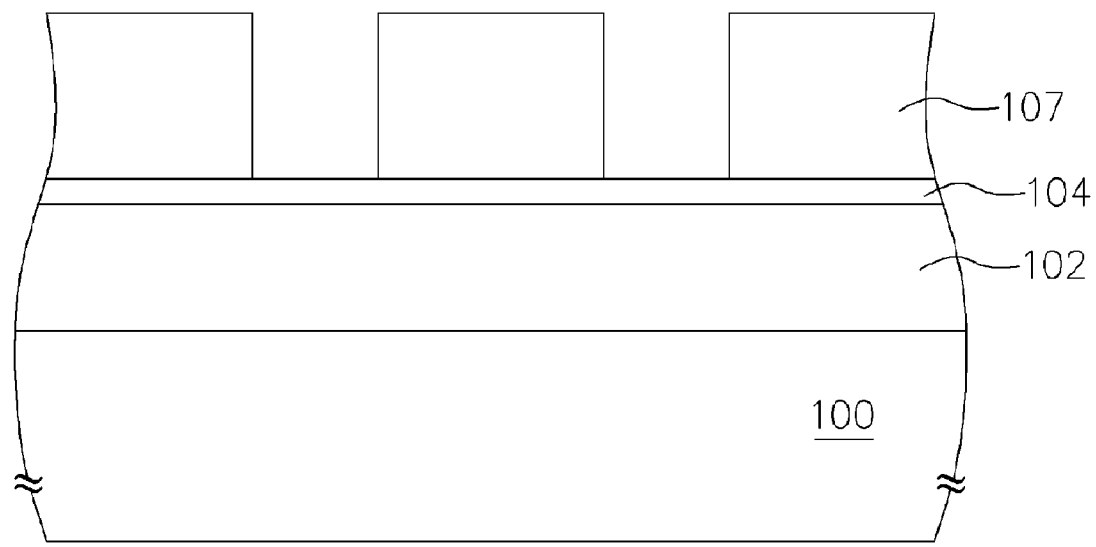

Referring to FIG. 1B, a patterned photoresist layer 107 is formed on the BARC 104. The method for forming the patterned photoresist layer 107 may include the following steps. A photoresist layer is formed on the BARC 104 with spin-coating and baking, and is then patterned using a lithography method. The material solution for coating the photoresist layer includes a resin, a solvent and a photosensitive agent.

Figure 1C:
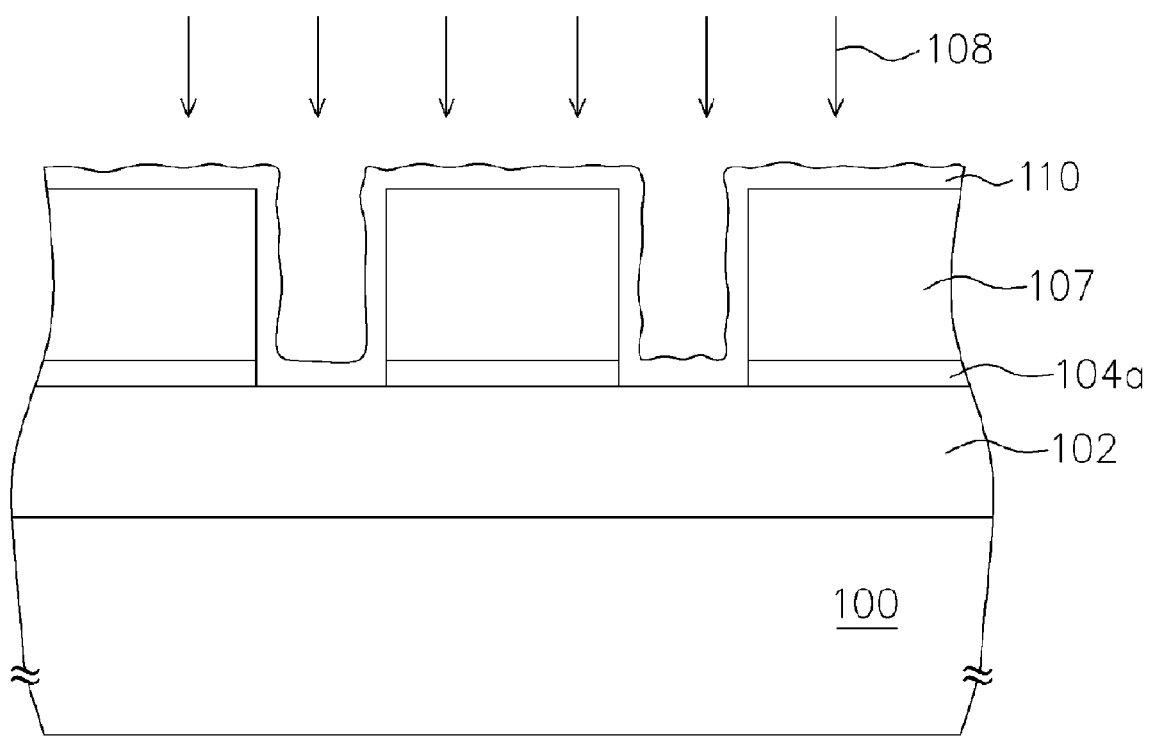

Referring to FIG. 1C, an etching step 108 is performed to the BARC 104 using the patterned photoresist layer 107 as a mask, so as to form a patterned BARC 104a.

As shown in FIG. 1C, during the etching step 108, a polymer layer 110 as an etching by-product is formed on the patterned photoresist layer 107. The polymer layer 110 will reduce the accuracy of the pattern transfer to the material layer 102 and increase the critical dimension of the patterned photoresist layer 107.

Figure 1D:
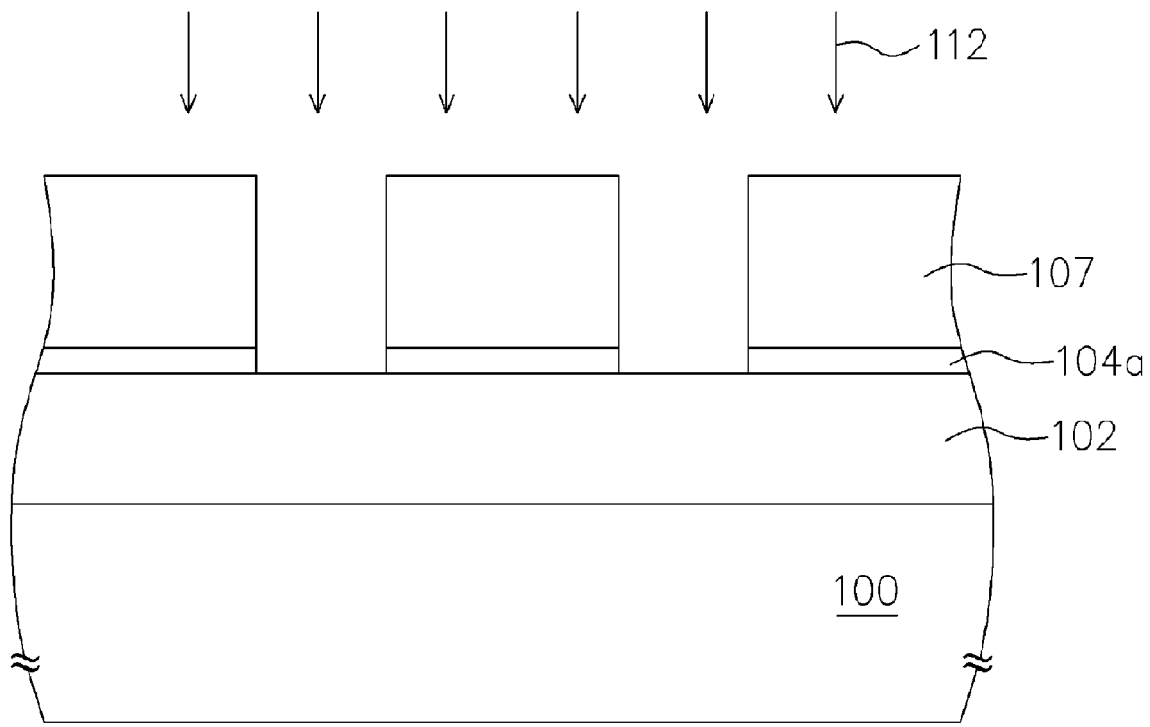

Referring to FIG. 1D, a cleaning step 112 is conducted to remove the polymer layer 110 from the patterned photoresist layer 107.

The cleaning step 112 preferably utilizes an ionized gas to remove the polymer layer 110. The ionized gas preferably has a higher etching rate to the polymer than to the material layer 102, so that the material layer 102 is substantially not damaged.

For example, when the material layer 102 is a polysilicon layer, the ionized gas preferably contains fluorine ions, oxygen ions or a combination thereof.

Figure 1E:
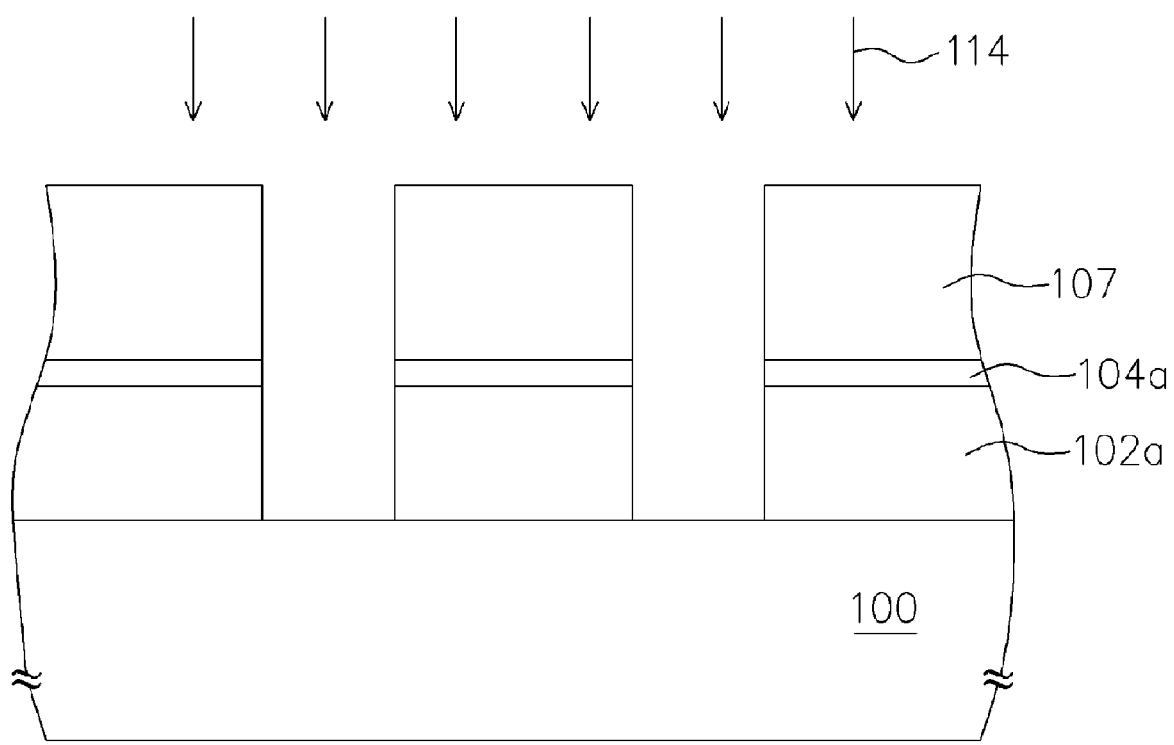

Referring to FIG. 1E, after the cleaning step 112 is conducted, an etching step 114 is performed to pattern the material layer 102 using the patterned photoresist layer 107 as a mask. A patterned material layer 102a is thus obtained.

Since the cleaning step is performed to remove the polymer layer 110 from the patterned photoresist layer 107 before the material layer 102 is etched, the photoresist patterns can be accurately transferred to the material layer 102, and the critical dimension is not affected.

Moreover, after the patterned photoresist layer 107 is formed, it can be trimmed to reduce its linewidth, wherein plasma may be used to isotropically etch the patterned photoresist layer 107. Alternatively, the trimming step can be done with a solution that can etch the patterned photoresist layer 107 isotropically to reduce its linewidth.

Furthermore, in another preferred embodiment, the step of trimming the patterned photoresist layer 107, the etching step 108 of the BARC 104, the cleaning step 112 and the etching step 114 of the material layer 102 can be performed in-situ. Specifically, when the step of trimming the patterned photoresist layer 107 and the cleaning step 112 both utilize dry-etching methods like plasma etching, the four steps can be conducted in the same dry-etching chamber or machine. Thus, the fabrication process can be simplified, and damages to the wafer due to transportation between different machines can be prevented.

In summary, this invention includes a cleaning step for removing the polymer generated in the etching step of the BARC, so than the photoresist patterns can be transferred accurately and the critical dimension can be kept unchanged. Moreover, a trimming step can be performed to reduce the linewidth of the patterned photoresist layer after the patterned photoresist layer is formed.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. An etching process, comprising:
   providing a material layer having a bottom anti-reflection coating (BARC) and a patterned photoresist layer thereon;
   etching the BARC using the patterned photoresist layer as a mask, wherein polymer as an etching by-product is formed on the patterned photoresist layer;
   performing a cleaning step to remove the polymer from the patterned photoresist layer; and
   etching the material layer using the patterned photoresist layer as a mask, wherein the cleaning step is performed before the step of etching the material layer.

2. The etching process of claim 1, wherein the BARC comprises an inorganic material.

3. The etching process of claim 1 wherein the BARC comprises an organic material.

4. The etching process of claim 1, further comprising trimming the patterned photoresist layer after the material layer is provided.

5. The etching process of claim 1, wherein the cleaning step comprises using an ionized gas to remove the polymer from the patterned photoresist layer.

6. The etching process of claim 5, wherein the ionized gas has a higher etching rate to the polymer than to the material layer.

7. The etching process of claim 1, wherein the material layer comprises a polysilicon layer.

8. The etching process of claim 5, wherein the ionized gas contains fluorine ions, oxygen ions, or a combination thereof.

9. A patterning process, comprising:
   sequentially forming a bottom anti-reflection coating (BARC) and a photoresist layer on a material layer;
   performing a lithography process to pattern the photoresist layer;
   trimming the patterned photoresist layer;
   etching the BARC using the patterned photoresist layer as a mask, wherein polymer as an etching by-product is formed on the patterned photoresist layer;
   performing a cleaning step to remove the polymer from the patterned photoresist layer, and
   etching the material layer using the patterned photoresist layer as a mask, wherein the cleaning step is performed before the step of etching the material layer,
   wherein the step of etching the BARC, the cleaning step and the step of etching the material layer are performed in-situ.

10. The patterning process of claim 9, wherein the BARC comprises an inorganic material.

11. The patterning process of claim 9, wherein the BARC comprises an organic material.

12. The patterning process of claim 9, wherein the cleaning step comprises using an ionized gas to remove the polymer from the patterned photoresist layer.

13. The patterning process of claim 12, wherein the ionized gas has a higher etching rate to the polymer than to the material layer.

14. The patterning process of claim 9, wherein the material layer comprises a polysilicon layer.

15. The patterning process of claim 14, wherein the ionized gas contains fluorine ions, oxygen ions, or a combination thereof.

* * * * *